US011721722B2

United States Patent
Gu et al.

(10) Patent No.: US 11,721,722 B2
(45) Date of Patent: Aug. 8, 2023

(54) BIPOLAR JUNCTION TRANSISTORS INCLUDING A STRESS LINER

(71) Applicant: GlobalFoundries U.S. Inc., Malta, NY (US)

(72) Inventors: Man Gu, Malta, NY (US); Jagar Singh, Clifton Park, NY (US); Haiting Wang, Clifton Park, NY (US); Jeffrey Johnson, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 69 days.

(21) Appl. No.: 17/524,438

(22) Filed: Nov. 11, 2021

(65) Prior Publication Data

US 2023/0063900 A1    Mar. 2, 2023

Related U.S. Application Data

(60) Provisional application No. 63/237,829, filed on Aug. 27, 2021.

(51) Int. Cl.
*H01L 29/10* (2006.01)
*H01L 29/08* (2006.01)
*H01L 29/735* (2006.01)
*H01L 29/737* (2006.01)
*H01L 29/06* (2006.01)
(Continued)

(52) U.S. Cl.
CPC ...... *H01L 29/1008* (2013.01); *H01L 29/0649* (2013.01); *H01L 29/0808* (2013.01); *H01L 29/0817* (2013.01); *H01L 29/0821* (2013.01); *H01L 29/66242* (2013.01); *H01L 29/735* (2013.01); *H01L 29/737* (2013.01); *H01L 29/7842* (2013.01)

(58) Field of Classification Search
CPC ............ H01L 29/1008; H01L 29/0649; H01L 29/0808; H01L 29/0817; H01L 29/0821; H01L 29/66242; H01L 29/735; H01L 29/737
See application file for complete search history.

(56) References Cited

U.S. PATENT DOCUMENTS

| | | |
|---|---|---|
| 7,102,205 B2 | 9/2006 | Chidambarrao et al. |
| 9,536,788 B1 | 1/2017 | Ning et al. |
| 9,748,369 B2 | 8/2017 | Liu |

(Continued)

OTHER PUBLICATIONS

Yau, J.B. et al., "SiGe-on-Insulator Symmetric Lateral Bipolar Transistors," 2015 IEEE SOI-3D-Subthreshold Microelectronics Technology Unified Conference (S3S), pp. 1-2, doi: 10.1109/S3S.2015.7333533 (2015).

*Primary Examiner* — Syed I Gheyas
(74) *Attorney, Agent, or Firm* — Thompson Hine LLP; Francois Pagette

(57) ABSTRACT

Structures for a bipolar junction transistor and methods of forming a structure for a bipolar junction transistor. The structure includes a collector having a raised portion, an emitter having a raised portion, and a base laterally arranged between the raised portion of the emitter and the raised portion of the collector. The base includes an intrinsic base layer and an extrinsic base layer stacked with the intrinsic base layer. The structure further includes a stress liner positioned to overlap with the raised portion of the collector, the raised portion of the emitter, and the extrinsic base layer.

20 Claims, 6 Drawing Sheets

(51) Int. Cl.
*H01L 29/66* (2006.01)
*H01L 29/78* (2006.01)

(56) References Cited

U.S. PATENT DOCUMENTS

| | | |
|---|---|---|
| 9,825,157 B1 | 11/2017 | Jain et al. |
| 9,984,871 B2 | 5/2018 | Balakrishnan et al. |
| 2001/0054746 A1* | 12/2001 | Yamada .............. H01L 29/1008 257/565 |
| 2008/0054357 A1 | 3/2008 | Chidambarrao et al. |

* cited by examiner

BIPOLAR JUNCTION TRANSISTORS INCLUDING A STRESS LINER

CROSS-REFERENCE TO RELATED APPLICATIONS

This application claims the benefit of U.S. Provisional Application No. 63/237,829, filed Aug. 27, 2021, which is hereby incorporated by reference herein in its entirety.

BACKGROUND

The invention relates generally to semiconductor devices and integrated circuit fabrication and, in particular, to structures for a bipolar junction transistor and methods of forming a structure for a bipolar junction transistor.

A bipolar junction transistor is a multi-terminal electronic device that includes an emitter, a collector, and an intrinsic base arranged between the emitter and collector. In an NPN bipolar junction transistor, the emitter and collector are comprised of n-type semiconductor material, and the intrinsic base is comprised of p-type semiconductor material. In a PNP bipolar junction transistor, the emitter and collector are comprised of p-type semiconductor material, and the intrinsic base is comprised of n-type semiconductor material. During operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials of the terminals have different energy bandgaps, which creates heterojunctions. For example, the collector and/or emitter of a heterojunction bipolar transistor may be constituted by silicon, and the intrinsic base of a heterojunction bipolar transistor may be constituted by a silicon-germanium alloy, which is characterized by a narrower band gap than silicon.

Improved structures for a bipolar junction transistor and methods of forming a structure for a bipolar junction transistor are needed.

SUMMARY

In an embodiment, a structure for a bipolar junction transistor is provided. The structure includes a collector having a raised portion, an emitter having a raised portion, and a base laterally arranged between the raised portion of the emitter and the raised portion of the collector. The base includes an intrinsic base layer and an extrinsic base layer stacked with the intrinsic base layer. The structure further includes a stress liner positioned to overlap with the raised portion of the collector, the raised portion of the emitter, and the extrinsic base layer.

In an embodiment, a method of forming a structure for a bipolar junction transistor is provided. The method includes forming a raised portion of a collector and a raised portion of an emitter on a semiconductor layer, forming an intrinsic base layer laterally arranged between the raised portion of the emitter and the raised portion of the collector, and forming an extrinsic base layer stacked with the intrinsic base layer. The method further includes forming a stress liner positioned to overlap with the raised portion of the collector, the raised portion of the emitter, and the extrinsic base layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
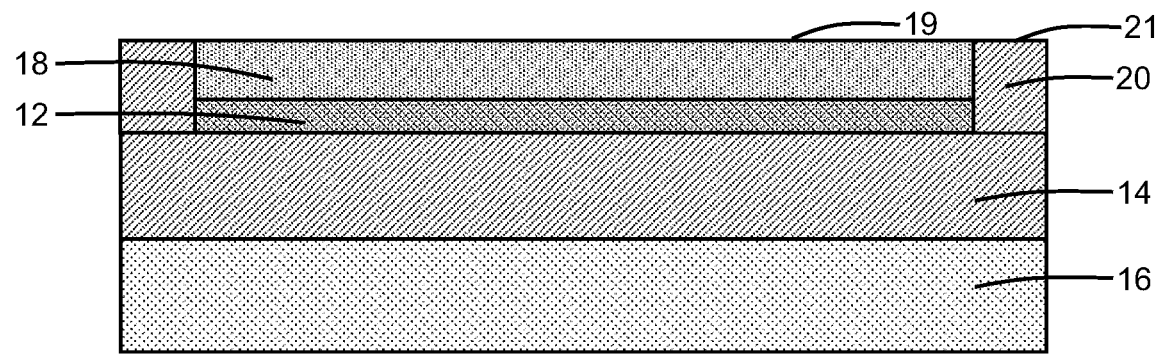
FIGS. 1-9 are cross-sectional views at successive fabrication stages of a processing method for fabricating a device structure in accordance with embodiments of the invention.

With reference to FIG. 1 and in accordance with embodiments of the invention, a semiconductor-on-insulator (SOI) substrate includes a device layer 12 defining a semiconductor layer, a buried insulator layer 14, and a handle substrate 16. The device layer 12 is separated from the handle substrate 16 by the intervening buried insulator layer 14 and is considerably thinner than the handle substrate 16. The device layer 12 and the handle substrate 16 may be comprised of a semiconductor material, such as single-crystal silicon, and may be lightly doped to have, for example, p-type conductivity, and the buried insulator layer 14 may be comprised of a dielectric material, such as silicon dioxide. The buried insulator layer 14 has a lower interface with the handle substrate 16 and an upper interface with the device layer 12. The device layer 12 is electrically isolated from the handle substrate 16 by the buried insulator layer 14. In an embodiment, the device layer 12 may have a thickness between the upper and lower interfaces in a range of about 4 nanometers (nm) to about 100 nm, and the device layer 12 may be used to fabricate fully-depleted silicon-on-insulator (FDSOI) device structures.

A semiconductor layer 18 is formed on the device layer 12. In an embodiment, the semiconductor layer 18 may contain silicon-germanium that is heavily doped with a p-type dopant (e.g., boron) to provide p-type conductivity. In an embodiment, the semiconductor layer 18 may be epitaxially grown from the device layer 12.

A shallow trench isolation region 20 may be formed that extends fully through the device layer 12 and semiconductor layer 18 to the buried insulator layer 14 by etching trenches using a patterned hardmask, depositing a dielectric material, such as silicon dioxide, in the trenches, and planarizing with chemical-mechanical polishing. The shallow trench isolation region 20 surrounds an active region of the device layer 12 and semiconductor layer 18 in which a bipolar junction transistor may be subsequently formed. In an embodiment, the shallow trench isolation region 20 has a top surface 21 that is coplanar with a top surface 19 of the semiconductor layer 18. In an embodiment, the shallow trench isolation region 20 has a top surface 21 that is substantially coplanar with a top surface 19 of the semiconductor layer 18.

Figure 2:
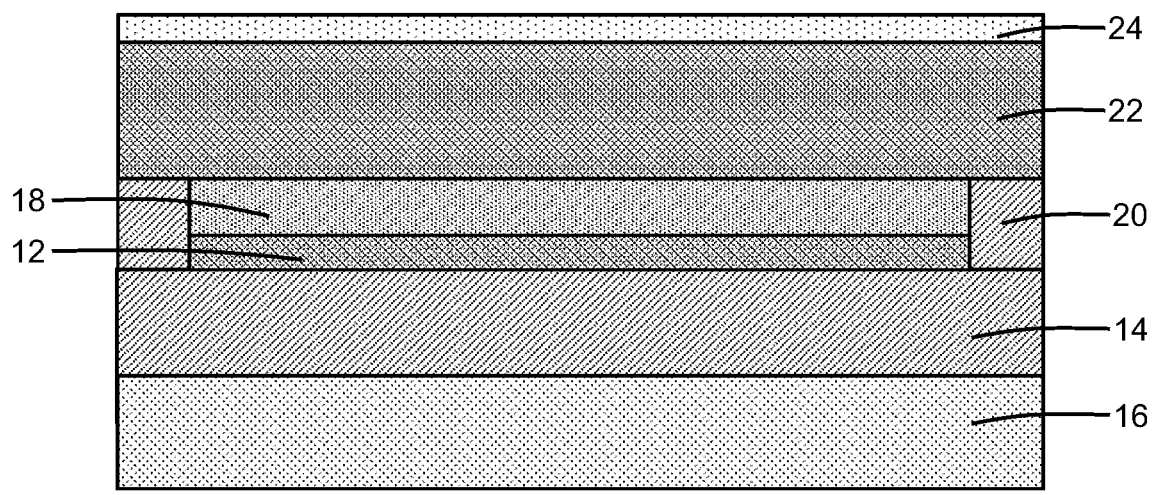

With reference to FIG. 2 in which like reference numerals refer to like features in FIG. 1 and at a subsequent fabrication stage, a semiconductor layer 22 and a dielectric layer 24 are formed in a layer stack on the semiconductor layer 18 and shallow trench isolation region 20. In an embodiment, the semiconductor layer 22 may be comprised of heavily-doped p-type polysilicon, and the dielectric layer 24 may be comprised of silicon nitride. The semiconductor layer 22 is arranged in a vertical direction between the dielectric layer 24 and the semiconductor layer 18.

Figure 3:
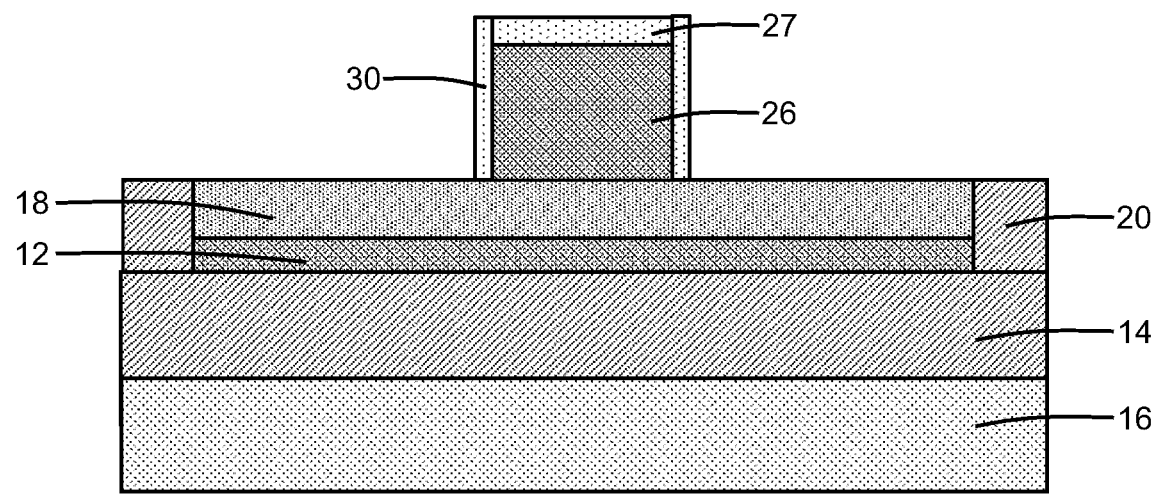

With reference to FIG. 3 in which like reference numerals refer to like features in FIG. 2 and at a subsequent fabrication stage, the semiconductor layer 22 and dielectric layer 24 of the layer stack are patterned to respectively define an extrinsic base layer 26 of the bipolar junction transistor and a cap 27 that is arranged over the extrinsic base layer 26. A spacer 30 is formed at the side edges of the extrinsic base layer 26 and cap 27 by anisotropically etching a deposited conformal dielectric layer. The spacer 30, which surrounds the extrinsic base layer 26, may be comprised of a dielectric material, such as silicon nitride.

Figure 4:
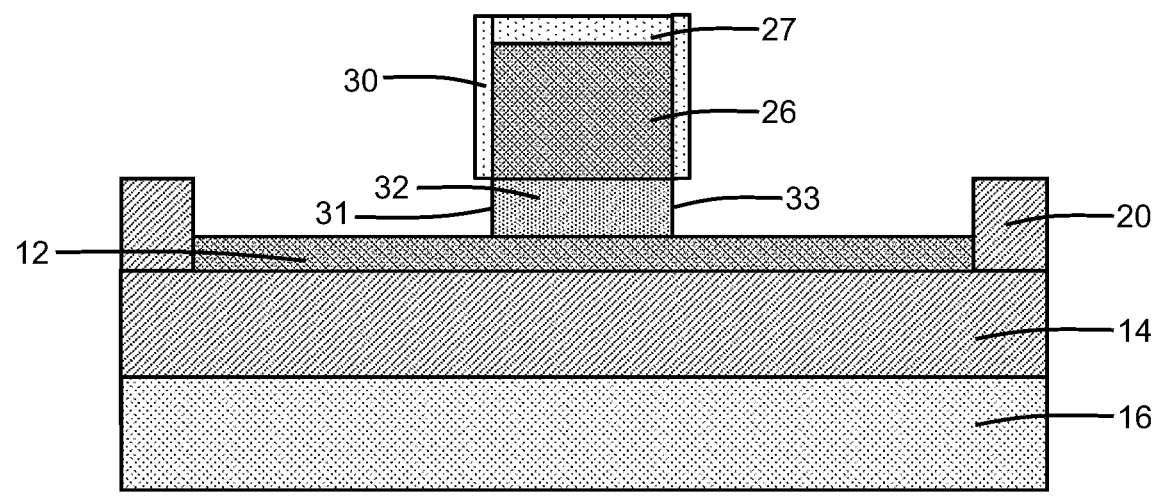

With reference to FIG. 4 in which like reference numerals refer to like features in FIG. 3 and at a subsequent fabrication stage, sections of the semiconductor layer 18 surrounding the capped extrinsic base layer 26 and spacer 30 are removed. In an embodiment, the sections of the semiconductor layer 18 may be removed selective to the device layer 12 by, for example, a reactive ion etching process with the capped extrinsic base layer 26 functioning as an etch mask. A residual section of the semiconductor layer 18 preserved beneath the capped extrinsic base layer 26 defines an intrinsic base layer 32 of the device structure. Sections of the device layer 12 are exposed adjacent to the opposite sidewalls of the capped extrinsic base layer 26 and the sidewalls 31, 33 of the underlying intrinsic base layer 32. The semiconductor layer 18 may be laterally etched to define shallow cavities as undercuts that extend laterally beneath the spacer 30 to the opposite sidewalls 31, 33 of the intrinsic base layer 32. The extrinsic base layer 26 and the intrinsic base layer 32 collectively define a base of the bipolar junction transistor.

Figure 5:
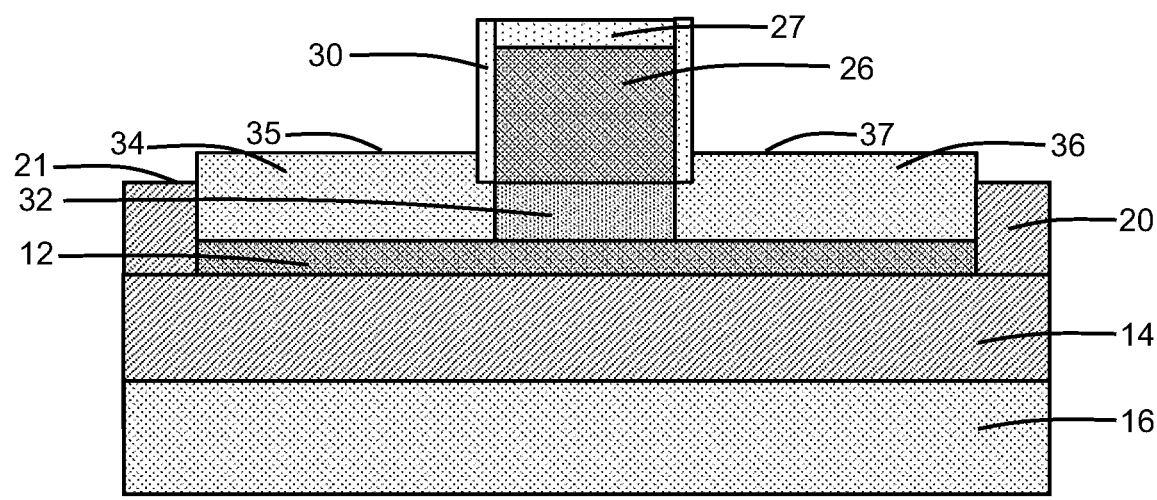

With reference to FIG. 5 in which like reference numerals refer to like features in FIG. 4 and at a subsequent fabrication stage, semiconductor layers 34, 36 are formed on the exposed portions of the device layer 12 adjacent to the opposite sidewalls of the capped extrinsic base layer 26 and the opposite sidewalls 31, 33 (FIG. 4) of the intrinsic base layer 32. In an embodiment, the top surface 21 of the shallow trench isolation region 20 is positioned closer to device layer 12 than to the top surfaces 35, 37 of the semiconductor layers 34, 36. The semiconductor layers 34, 36 may provide terminals (i.e., an emitter and a collector) of the bipolar junction transistor.

The semiconductor layers 34, 36 include portions in the shallow cavities between the device layer 12 and the spacer 30. The intrinsic base layer 32 has a height in a vertical direction relative to the device layer 12. The portion of the semiconductor layer 34 in one of the shallow cavities adjoins the sidewall 31 of the intrinsic base layer 32 over a full height of the sidewall 31. The portion of the semiconductor layer 36 in the other of the shallow cavities adjoins the sidewall 33 of the intrinsic base layer 32 over a full height of the sidewall 33. A lower portion of the extrinsic base layer 26 is fully separated from the semiconductor layers 34, 36 at its sidewalls by the spacer 30.

The semiconductor layers 34, 36 may be comprised of a semiconductor material, such as silicon, and may be concurrently formed. The semiconductor layers 34, 36 may be doped (e.g., heavily doped) with a concentration of a dopant, such as an n-type dopant (e.g., phosphorus) to provide n-type conductivity. The semiconductor layers 34, 36 may be formed using an epitaxial growth process and may contain single-crystal semiconductor material (e.g., single-crystal silicon). The epitaxial growth process may be selective such that the semiconductor material does not form on dielectric materials, such as the shallow trench isolation region 20. The crystal structure of the single-crystal semiconductor material of the device layer 12 serves as a crystalline template for the crystal structure of the single-crystal semiconductor material of the semiconductor layers 34, 36.

Figure 6:
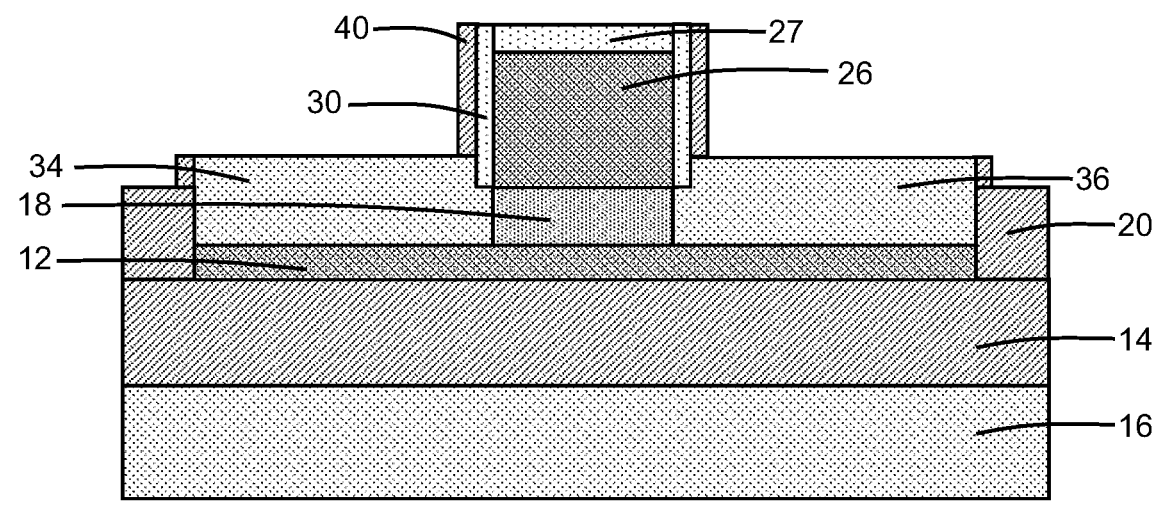

With reference to FIG. 6 in which like reference numerals refer to like features in FIG. 5 and at a subsequent fabrication stage, a spacer 40 is formed that surrounds the capped extrinsic base layer 26 in spaces between the capped extrinsic base layer 26 and the semiconductor layers 34, 36. The spacer 40, which may be comprised of silicon dioxide, may be formed by depositing a conformal dielectric layer and anisotropically etching the deposited dielectric layer 38. A spacer may be concurrently formed at the outer peripheral edges of the semiconductor layers 34, 36.

Figure 7:
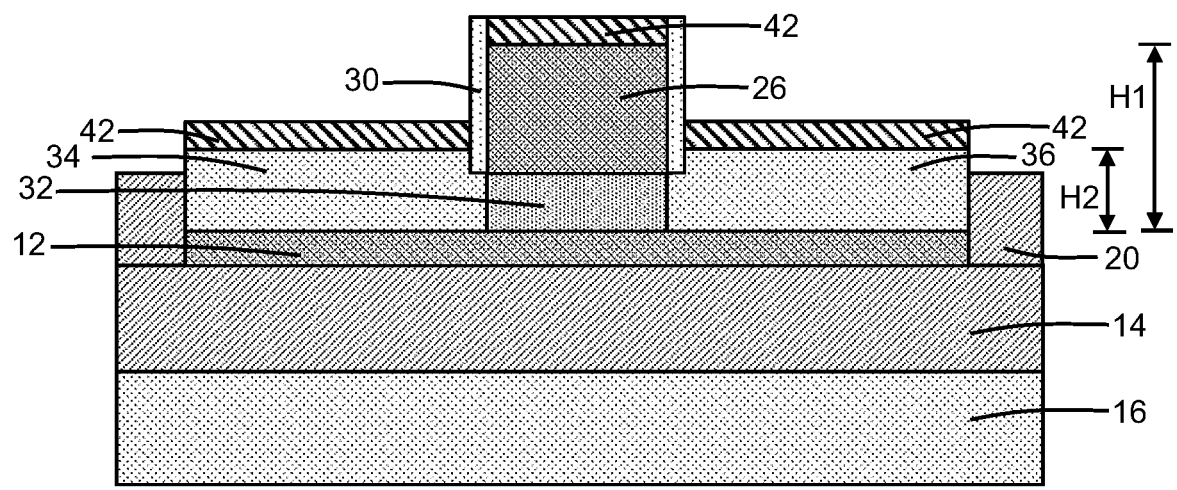

With reference to FIG. 7 in which like reference numerals refer to like features in FIG. 6 and at a subsequent fabrication stage, an etching process is performed to remove the cap 27 from the extrinsic base layer 26. The spacer 30 may be shortened by the etching process. The spacers 40, 41 may be removed by the same, or another, etching process.

A silicide layer 42 is formed in sections on the semiconductor layers 34, 36 providing terminals of the bipolar junction transistor and on the extrinsic base layer 26. The silicide layer 42, which is formed by a silicidation process, may contain, for example, nickel silicide. The silicidation process may involve the deposition of a conformal layer of a silicide-forming metal (e.g., nickel) by, for example, chemical vapor deposition or physical vapor deposition, followed by one or more annealing steps (e.g., rapid thermal annealing) to form a silicide phase by reacting the layer of silicide-forming metal and the semiconductor material contacting the layer of silicide-forming metal.

Following the formation of the sections of the silicide layer 42, the extrinsic base layer 26 and intrinsic base layer 32 collectively have a height H1, and each of the semiconductor layers 34, 36 has a height H2. In an embodiment, the heights H2 of the semiconductor layers 34, 36 may be equal or substantially equal. In an embodiment, the height H1 is greater than the height H2.

Figure 8:
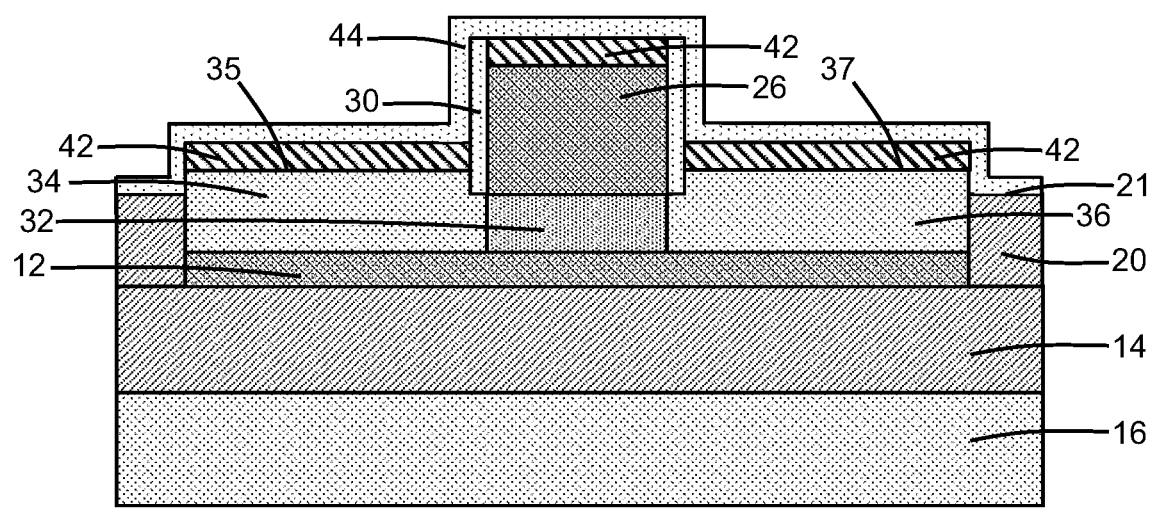

With reference to FIG. 8 in which like reference numerals refer to like features in FIG. 7 and at a subsequent fabrication stage, a stress liner 44 is applied over the extrinsic base layer 26 and the semiconductor layers 34, 36 providing the terminals of the bipolar junction transistor. The stress liner 44 may be comprised of a dielectric material, such as silicon nitride, deposited by plasma-enhanced chemical vapor deposition under deposition conditions that cause the dielectric material to be under stress. In an embodiment, the deposition conditions may cause stress liner 44 to incorporate tensile strain, which is transferred as tensile stress (e.g., biaxial tensile stress) to the extrinsic base layer 26 and semiconductor layers 34, 36.

The stress liner 44 extends continuously (i.e., without interruption or break) over the extrinsic base layer 26, semiconductor layers 34, 36, and the shallow trench isolation region 20 as a conformal film or coating. The stress liner 44 is positioned on the extrinsic base layer 26 and both of the semiconductor layers 34, 36, as well as on the shallow trench isolation region 20 adjacent to the semiconductor layer 34 and on the shallow trench isolation region 20 adjacent to the semiconductor layer 36. In that regard, the stress liner 44 includes sections that extend in a horizontal direction across, and overlap with, the extrinsic base layer 26, each of the semiconductor layers 34, 36, and the shallow trench isolation region 20. The horizontal sections of the stress liner 44 may directly contact the extrinsic base layer 26, directly contact each of the semiconductor layers 34, 36, and directly contact the shallow trench isolation region 20. In that regard, the stress liner 44 includes sections that extend in a vertical direction adjacent to an upper portion of the extrinsic base layer 26.

Figure 9:
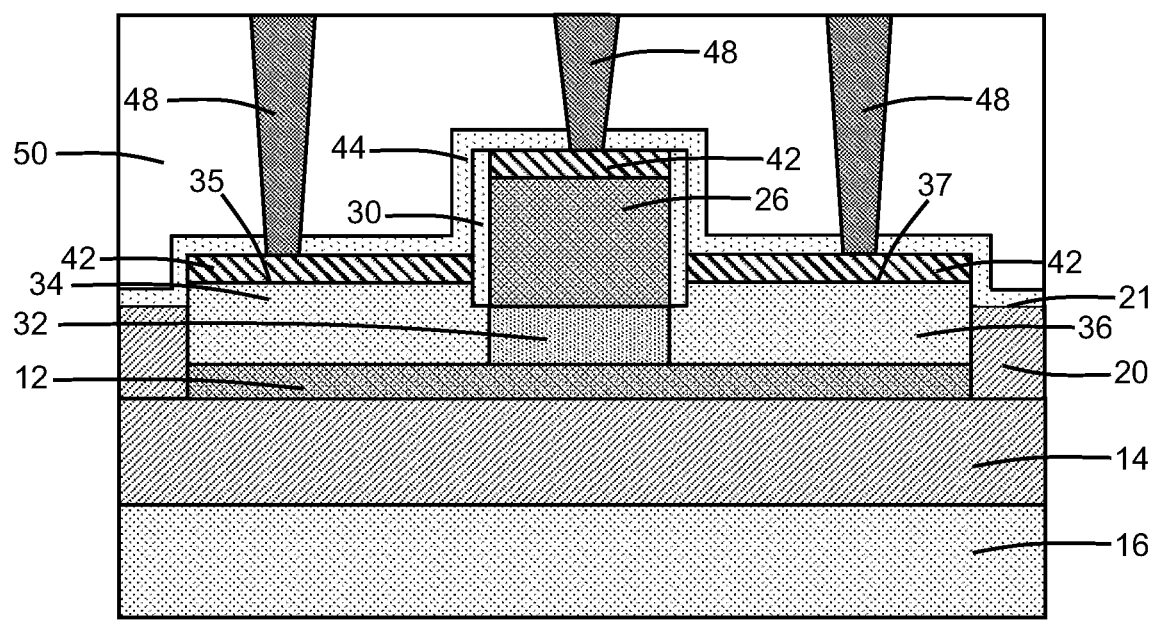

With reference to FIG. 9 in which like reference numerals refer to like features in FIG. 8 and at a subsequent fabrication stage, contacts 48, which are formed by middle-of-line processing in a dielectric layer 50, may be respectively physically and electrically connected to the sections of the silicide layer 42 on the semiconductor layers 34, 36 and the extrinsic base layer 26.

The resultant structure is a lateral bipolar junction transistor (or heterojunction bipolar transistor) with a lateral emitter/base/collector arrangement. The stress liner 44 may be effective for improving the carrier mobility in the bipolar junction transistor such that a higher frequency (fT/fmax) can be achieved for radiofrequency applications. The stacked arrangement of the intrinsic base layer 32 and extrinsic base layer 26 may permit a narrow base width (e.g., about 10 nm to about 20 nm) for the intrinsic base layer 32 while simultaneously providing a larger surface area on the extrinsic base layer 26 for contact landing.

In an embodiment, the stress liner 44 may be particularly effective for improving the performance of an NPN bipolar junction transistor or an NPN heterojunction bipolar transistor. In particular, the device arrangement may result in the transfer of a significantly higher level of stress to the semiconductor layers 34, 36 than to the intrinsic base layer 32. With regard to tailoring the stress transfer, the top surface 21 of the shallow trench isolation region 20 may be positioned in elevation between the top surfaces 35, 37 of the semiconductor layers 34, 36 and the device layer 12, the intrinsic base layer 32 may be arranged in elevation fully between the top surfaces 35, 37 of the semiconductor layers 34, 36 and the device layer 12, and the height of the extrinsic base layer 26 and positioning of the intrinsic base layer 32 may provide a significant spacing between the intrinsic base layer 32 and the stress liner 44.

In an alternative embodiment, the stress liner 44 may be applied to a PNP bipolar junction transistor or a PNP heterojunction bipolar transistor. In that regard, the deposition conditions for the stress liner 44 may be adjusted to incorporate compressive strain, which is transferred as compressive stress to the n-type extrinsic base layer 26 and the p-type semiconductor layers 34, 36 of the PNP bipolar junction transistor or PNP heterojunction bipolar transistor.

Figure 10:
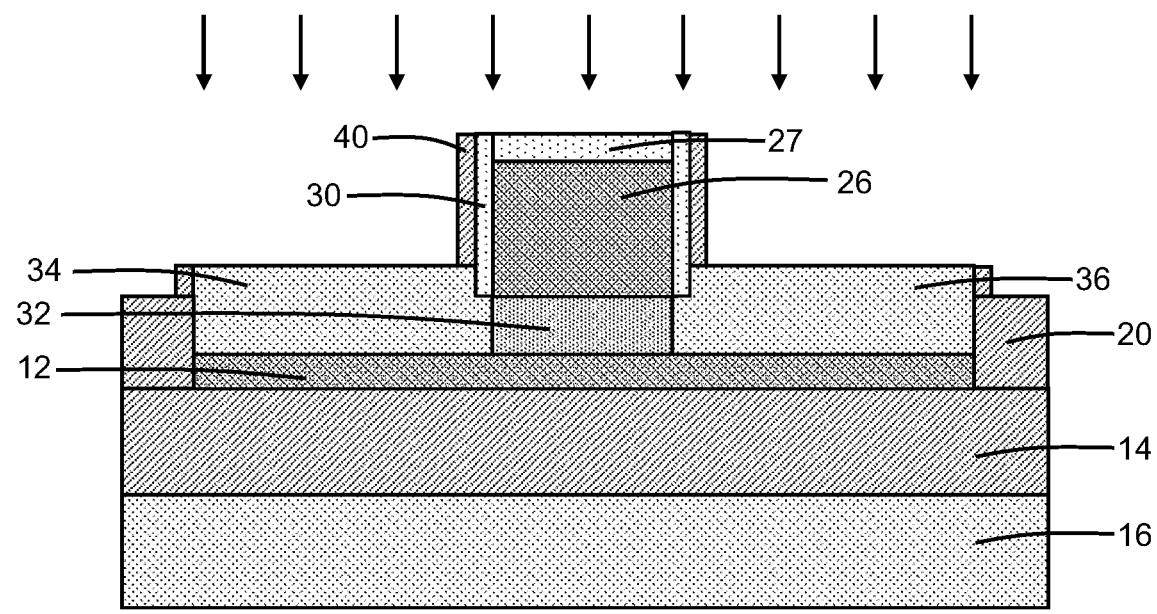
FIGS. 10 and 10A are cross-sectional views in accordance with alternative embodiments of the invention.
Figure 10A:
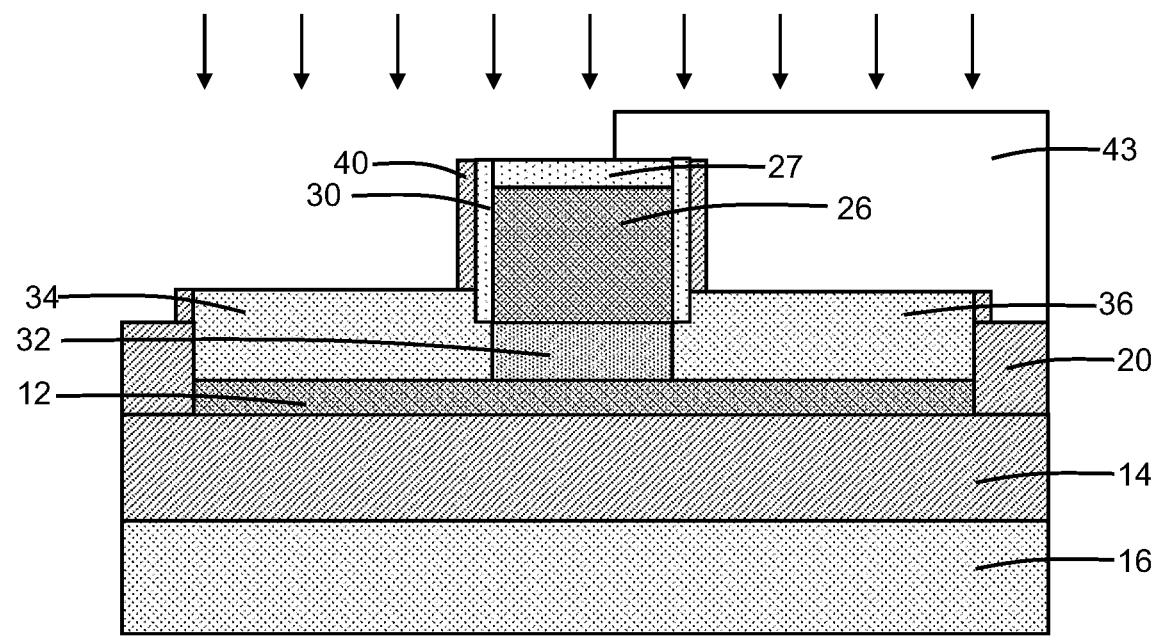

With reference to FIGS. 10, 10A and in accordance with alternative embodiments, one or both of the semiconductor layers 34, 36 may be ion implanted, as indicated by the single-headed arrows, to increase the dopant concentration. For example, the semiconductor layers 34, 36 may be implanted with ions containing an n-type dopant (e.g., phosphorus) to increase the concentration of the n-type dopant. As shown in FIG. 10A, an implantation mask 43 may be applied, for example, as a patterned spin-on hardmask to provide for an asymmetric implantation of, for example, only semiconductor layer 34.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate ±10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a bipolar junction transistor, the structure comprising:
   a collector including a raised portion;
   an emitter including a raised portion;
   a base laterally arranged between the raised portion of the emitter and the raised portion of the collector, the base including an intrinsic base layer and an extrinsic base layer stacked with the intrinsic base layer; and
   a stress liner positioned to overlap with the raised portion of the collector, the raised portion of the emitter, and the extrinsic base layer.

2. The structure of claim 1 further comprising:
   a semiconductor layer,
   wherein the raised portion of the collector is positioned on the semiconductor layer, the raised portion of the emitter is positioned on the semiconductor layer, and the intrinsic base layer is positioned on the semiconductor layer.

3. The structure of claim 2 further comprising:
   a handle substrate; and
   a dielectric layer arranged in a vertical direction to separate the handle substrate from the semiconductor layer.

4. The structure of claim 2 further comprising:
a shallow trench isolation region surrounding the semiconductor layer, the shallow trench isolation region having a top surface,
wherein the intrinsic base layer has a top surface that is coplanar with the top surface of the shallow trench isolation region.

5. The structure of claim 4 wherein the raised portion of the collector has a top surface, and the top surface of the shallow trench isolation region is positioned in elevation between the top surface of the raised portion of the collector and the semiconductor layer.

6. The structure of claim 4 wherein the raised portion of the emitter has a top surface, and the top surface of the shallow trench isolation region is positioned in elevation between the top surface of the raised portion of the emitter and the semiconductor layer.

7. The structure of claim 4 wherein the raised portion of the collector has a top surface, and the intrinsic base layer is fully arranged in elevation between the top surface of the raised portion of the collector and the semiconductor layer.

8. The structure of claim 4 wherein the raised portion of the emitter has a top surface, and the intrinsic base layer is fully arranged in elevation between the top surface of the raised portion of the emitter and the semiconductor layer.

9. The structure of claim 2 wherein the raised portion of the collector has a first height relative to the semiconductor layer, the raised portion of the emitter has a second height relative to the semiconductor layer, the base has a third height relative to the semiconductor layer, the third height is greater than the first height, and the third height is greater than the second height.

10. The structure of claim 1 wherein the intrinsic base layer comprises a first p-type semiconductor material, the extrinsic base layer comprises a second p-type semiconductor material, and the raised portion of the collector and the raised portion of the emitter comprise an n-type semiconductor material.

11. The structure of claim 10 wherein the raised portion of the collector and the raised portion of the emitter include different concentrations of an n-type dopant.

12. The structure of claim 10 wherein the first p-type semiconductor material is p-type silicon germanium, and the second p-type semiconductor material is p-type polysilicon.

13. The structure of claim 10 further comprising:
a semiconductor layer,
wherein the raised portion of the collector is positioned on the semiconductor layer, the raised portion of the emitter is positioned on the semiconductor layer, the intrinsic base layer is positioned on the semiconductor layer, the raised portion of the collector has a top surface, the intrinsic base layer is fully arranged in elevation between the top surface of the raised portion of the collector and the semiconductor layer, and the intrinsic base layer is fully arranged in elevation between the top surface of the raised portion of the emitter and the semiconductor layer.

14. The structure of claim 1 further comprising:
a shallow trench isolation region adjacent to the raised portion of the collector and the raised portion of the emitter,
wherein the stress liner is positioned to overlap with the shallow trench isolation region.

15. The structure of claim 14 wherein the stress liner extends continuously over the raised portion of the collector, the raised portion of the emitter, the extrinsic base layer, and the shallow trench isolation region.

16. The structure of claim 1 wherein the stress liner extends continuously over the raised portion of the collector, the raised portion of the emitter, and the extrinsic base layer.

17. The structure of claim 1 wherein the intrinsic base layer includes a first sidewall that adjoins the raised portion of the emitter and a second sidewall that adjoins the raised portion of the collector, the raised portion of the emitter contacts the intrinsic base layer over a full height of the first sidewall, and the raised portion of the collector contacts the intrinsic base layer over a full height of the second sidewall.

18. A method of forming a structure for a bipolar junction transistor, the method comprising:
forming a raised portion of a collector and a raised portion of an emitter on a semiconductor layer;
forming an intrinsic base layer laterally arranged between the raised portion of the emitter and the raised portion of the collector;
forming an extrinsic base layer stacked with the intrinsic base layer; and
forming a stress liner positioned to overlap with the raised portion of the collector, the raised portion of the emitter, and the extrinsic base layer.

19. The method of claim 18 wherein the stress liner extends continuously over the raised portion of the collector, the raised portion of the emitter, and the extrinsic base layer.

20. The structure of claim 18 wherein the raised portion of the collector has a top surface, the intrinsic base layer is fully arranged in elevation between the top surface of the raised portion of the collector and the semiconductor layer, and the intrinsic base layer is fully arranged in elevation between the top surface of the raised portion of the emitter and the semiconductor layer.

* * * * *

UNITED STATES PATENT AND TRADEMARK OFFICE
CERTIFICATE OF CORRECTION

| | |
|---|---|
| PATENT NO. | : 11,721,722 B2 |
| APPLICATION NO. | : 17/524438 |
| DATED | : August 8, 2023 |
| INVENTOR(S) | : Man Gu et al. |

It is certified that error appears in the above-identified patent and that said Letters Patent is hereby corrected as shown below:

In the Claims

Column 8, Claim 20, Line 43 reads:
"20. The structure of claim 18 wherein the raised portion"

It should read:
--20. The method of claim 18 wherein the raised portion--

Signed and Sealed this
Twelfth Day of September, 2023

Katherine Kelly Vidal
*Director of the United States Patent and Trademark Office*